United States Patent
Prabhakar et al.

(10) Patent No.: US 10,903,665 B2
(45) Date of Patent: Jan. 26, 2021

(54) USAGE DATA BASED BATTERY CHARGE OR DISCHARGE TIME DETERMINATION

(71) Applicant: Microsoft Technology Licensing, LLC, Redmond, WA (US)

(72) Inventors: Sandeep Prabhakar, Bellevue, WA (US); Iulian D. Calinov, Sammamish, WA (US); Javier Nisim Flores Assad, Bothell, WA (US); Jihad Tafas, Redmond, WA (US)

(73) Assignee: MICROSOFT TECHNOLOGY LICENSING, LLC, Redmond, WA (US)

( * ) Notice: Subject to any disclaimer, the term of this patent is extended or adjusted under 35 U.S.C. 154(b) by 306 days.

(21) Appl. No.: 15/340,790

(22) Filed: Nov. 1, 2016

(65) Prior Publication Data

US 2018/0123358 A1 May 3, 2018

(51) Int. Cl.
*G06F 1/00* (2006.01)
*G06F 11/30* (2006.01)
(Continued)

(52) U.S. Cl.
CPC .......... *H02J 7/0021* (2013.01); *G01R 31/367* (2019.01); *G01R 31/382* (2019.01);
(Continued)

(58) Field of Classification Search
CPC ............... H02J 7/0021; G01R 31/3606; G01R 31/3651
(Continued)

(56) References Cited

U.S. PATENT DOCUMENTS

| 4,743,831 A | 5/1988 | Young |
| 5,270,946 A | 12/1993 | Shibasaki et al. |

(Continued)

FOREIGN PATENT DOCUMENTS

| CN | 102185164 | 9/2011 |
| CN | 10379304 | 5/2014 |

(Continued)

OTHER PUBLICATIONS

Rong, et al., "An Analytical Model for Predicting the Remaining Battery Capacity of Lithium-Ion Batteries", In Journal of IEEE Transactions on Very Large Scale IntegrationSystems, vol. 14, No. 5, May 2006, pp. 1-12.

(Continued)

*Primary Examiner* — Xuxing Chen

(57) ABSTRACT

Usage data of a device is maintained over some time period, such as a couple weeks or a couple months. This usage data reflects an amount of energy that is used or stored for different time durations each having a various combinations of different state values of the device, such as a screen state, a power source state, a power mode state, a battery saver state, a processor consumption state, and so forth. This provides a record of a capacity drain rate or capacity charge rate for the battery for each combination of state values. At any given time, the device can determine the current state values of the device. The capacity drain rates or capacity charge rates for previous time durations having the same state values as the current state values are used to determine an estimated capacity drain rate or capacity charge rate for the device.

20 Claims, 5 Drawing Sheets

(51) Int. Cl.
  *H02J 7/00*  (2006.01)
  *G01R 31/367*  (2019.01)
  *G01R 31/382*  (2019.01)
  *G06F 1/26*  (2006.01)
  *H02J 9/00*  (2006.01)

(52) U.S. Cl.
  CPC .............. *G06F 1/26* (2013.01); *H02J 7/0063* (2013.01); *H02J 9/002* (2013.01)

(58) Field of Classification Search
  USPC ............................................ 713/240; 702/63
  See application file for complete search history.

(56) References Cited

U.S. PATENT DOCUMENTS

| | | |
|---|---|---|
| 5,371,682 A | 12/1994 | Levine et al. |
| 5,565,759 A | 10/1996 | Dunstan |
| 5,656,920 A | 8/1997 | Cherng et al. |
| 5,757,163 A | 5/1998 | Brotto et al. |
| 6,225,780 B1 | 5/2001 | Koch |
| 6,288,521 B1 | 9/2001 | Meador |
| 6,289,399 B1 | 9/2001 | Furuichi et al. |
| 6,870,349 B2 | 3/2005 | Cook |
| 7,505,795 B1 | 3/2009 | Lim et al. |
| 7,576,517 B1 | 8/2009 | Cotton et al. |
| 7,663,344 B2 | 2/2010 | Le Gall et al. |
| RE41,676 E | 9/2010 | Yau et al. |
| 7,853,735 B2 | 12/2010 | Jin et al. |
| 7,915,860 B2 | 3/2011 | Quint et al. |
| 8,054,962 B2 | 11/2011 | Anglin et al. |
| 8,120,321 B2 | 2/2012 | Vezzini et al. |
| 8,126,517 B2 | 2/2012 | Ashbrook et al. |
| 8,135,443 B2 | 3/2012 | Aleksic et al. |
| 8,179,095 B1* | 5/2012 | Onorato ............. G01R 31/3606 320/132 |
| 8,237,411 B2 | 8/2012 | Liu et al. |
| 8,250,384 B2 | 8/2012 | Borghetti et al. |
| 8,452,353 B2 | 5/2013 | Crawford |
| 8,581,548 B2 | 11/2013 | Goff et al. |
| 8,599,840 B2 | 12/2013 | Albert et al. |
| 8,665,214 B2 | 3/2014 | Forutanpour et al. |
| 8,751,845 B2 | 6/2014 | Assad et al. |
| 8,762,756 B1 | 6/2014 | Moy |
| 8,798,685 B2 | 8/2014 | Stekkelpak et al. |
| 8,813,177 B2 | 8/2014 | Srour et al. |
| 8,872,481 B2 | 10/2014 | Chawla et al. |
| 8,917,061 B2 | 12/2014 | Zhu |
| 8,996,113 B2 | 3/2015 | Ries et al. |
| 9,009,502 B2 | 4/2015 | Udeshi et al. |
| 9,043,085 B2 | 5/2015 | Sisk |
| 9,058,128 B1 | 6/2015 | Robison et al. |
| 9,070,273 B2 | 6/2015 | Lombardi et al. |
| 9,152,202 B2 | 10/2015 | Seinfeld et al. |
| 9,189,055 B2 | 11/2015 | Yang et al. |
| 9,210,662 B1 | 12/2015 | Brown et al. |
| 9,377,839 B2 | 6/2016 | Sasidharan et al. |
| 9,385,557 B2 | 7/2016 | Causey et al. |
| 9,430,280 B1 | 8/2016 | Shih et al. |
| 9,431,828 B2 | 8/2016 | Besser et al. |
| 2003/0042741 A1 | 3/2003 | Hartman |
| 2004/0232892 A1 | 11/2004 | Aradachi et al. |
| 2005/0083016 A1 | 4/2005 | Yau et al. |
| 2005/0275372 A1 | 12/2005 | Crowell |
| 2006/0156045 A1* | 7/2006 | Galles ................. G06F 1/3203 713/300 |
| 2006/0184287 A1 | 8/2006 | Belady et al. |
| 2007/0083781 A1 | 4/2007 | Aoyagi |
| 2007/0247186 A1 | 10/2007 | Sakata et al. |
| 2008/0055311 A1 | 3/2008 | Aleksic et al. |
| 2008/0201587 A1 | 8/2008 | Lee |
| 2008/0306637 A1 | 12/2008 | Borumand et al. |
| 2009/0088991 A1 | 4/2009 | Brzezowski et al. |
| 2009/0249095 A1 | 10/2009 | Poornachandran et al. |
| 2010/0211804 A1 | 8/2010 | Brumley et al. |
| 2010/0287559 A1 | 11/2010 | Mergen |
| 2010/0304251 A1 | 12/2010 | Chan et al. |
| 2011/0047552 A1 | 2/2011 | Mergen et al. |
| 2011/0159931 A1 | 6/2011 | Boss et al. |
| 2011/0166810 A1* | 7/2011 | Grider ................. B60L 15/2045 702/63 |
| 2011/0288898 A1 | 11/2011 | Roe |
| 2012/0072752 A1 | 3/2012 | Kennedy et al. |
| 2012/0144219 A1 | 6/2012 | Salahshour et al. |
| 2012/0210150 A1 | 8/2012 | de lind van wijngaarden et al. |
| 2012/0210325 A1 | 8/2012 | de Lind van Wijngaarden et al. |
| 2012/0254634 A1 | 10/2012 | Chakra et al. |
| 2012/0260118 A1 | 10/2012 | Jiang et al. |
| 2012/0274279 A1 | 11/2012 | Banos et al. |
| 2012/0274641 A1 | 11/2012 | Diard |
| 2012/0299554 A1 | 11/2012 | Kruglick |
| 2012/0317432 A1* | 12/2012 | Assad ..................... G06F 1/329 713/340 |
| 2013/0009468 A1* | 1/2013 | Ishidera ................ H01M 10/44 307/24 |
| 2013/0093391 A1 | 4/2013 | Gale et al. |
| 2013/0176000 A1 | 7/2013 | Bishop et al. |
| 2013/0191662 A1 | 7/2013 | Ingrassia et al. |
| 2013/0231894 A1* | 9/2013 | Paakkonen ............ H02J 7/0073 702/183 |
| 2013/0257382 A1 | 10/2013 | Field et al. |
| 2013/0300374 A1 | 11/2013 | Tomita et al. |
| 2014/0042977 A1 | 2/2014 | Kim |
| 2014/0045436 A1 | 2/2014 | Gutierrez, Jr. |
| 2014/0136799 A1 | 5/2014 | Fortin |
| 2014/0195066 A1 | 7/2014 | Nanda et al. |
| 2014/0210265 A1 | 7/2014 | Thorsoe |
| 2014/0281645 A1 | 9/2014 | Sen et al. |
| 2014/0331068 A1 | 11/2014 | Cao |
| 2014/0356656 A1 | 12/2014 | Chen et al. |
| 2015/0048796 A1 | 2/2015 | Sherstyuk et al. |
| 2015/0212560 A1 | 7/2015 | Ueda |
| 2015/0227445 A1 | 8/2015 | Arscott et al. |
| 2015/0277454 A1 | 10/2015 | Carbone et al. |
| 2015/0293575 A1 | 10/2015 | Hampson et al. |
| 2015/0323974 A1 | 11/2015 | Shuster et al. |
| 2015/0347204 A1 | 12/2015 | Stanley-Marbell et al. |
| 2015/0351037 A1 | 12/2015 | Brown et al. |
| 2015/0357842 A1 | 12/2015 | Bailly et al. |
| 2016/0034022 A1 | 2/2016 | Sutardja et al. |
| 2016/0073351 A1 | 3/2016 | Cardozo et al. |
| 2016/0077562 A1 | 3/2016 | Smith |
| 2016/0146899 A1* | 5/2016 | Teng ..................... G01R 31/367 324/431 |
| 2016/0209906 A1 | 7/2016 | Chae et al. |
| 2016/0210174 A1 | 7/2016 | Hsieh et al. |
| 2016/0224648 A1* | 8/2016 | Le ..................... H04W 52/0258 |
| 2016/0231801 A1 | 8/2016 | Chandra et al. |
| 2016/0242119 A1 | 8/2016 | Shedletsky et al. |
| 2016/0248266 A1 | 8/2016 | Ferrese et al. |
| 2017/0133867 A1 | 5/2017 | Banos et al. |
| 2017/0346303 A1* | 11/2017 | Vanblon ................ H02J 7/007 |
| 2017/0371394 A1 | 12/2017 | Chan et al. |
| 2018/0123358 A1 | 5/2018 | Prabhakar et al. |
| 2018/0136704 A1 | 5/2018 | Jahagirdar et al. |
| 2018/0136708 A1 | 5/2018 | Jahagirdar et al. |
| 2018/0136709 A1 | 5/2018 | Jahagirdar et al. |
| 2018/0267839 A1 | 9/2018 | Maisuria et al. |
| 2018/0321731 A1 | 11/2018 | Alfano et al. |
| 2020/0004304 A1 | 1/2020 | Jahagirdar et al. |

FOREIGN PATENT DOCUMENTS

| | | |
|---|---|---|
| EP | 0727728 | 8/1996 |
| JP | 2015100236 A | 5/2015 |
| KR | 20110084768 | 7/2011 |
| KR | 101521585 | 5/2015 |
| WO | 9305560 A1 | 3/1993 |
| WO | WO-9305560 | 3/1993 |
| WO | 2006126022 A1 | 11/2006 |
| WO | WO-2009128079 | 10/2009 |
| WO | WO-2014039311 | 3/2014 |
| WO | WO-2016032908 | 3/2016 |

(56) References Cited

FOREIGN PATENT DOCUMENTS

| | | |
|---|---|---|
| WO | 2016133687 A1 | 8/2016 |
| WO | 2016133688 A1 | 8/2016 |
| WO | 2016160748 A1 | 10/2016 |

OTHER PUBLICATIONS

"International Search Report and Written opinion Issued in PCT Application No. PCT/US2017/060734", dated Apr. 3, 2018, 12 Pages.

"International Search Report and Written Opinion Issued in PCT Application No. PCT/US2017/060736", dated Apr. 18, 2018, 25 Pages.

"Invitation to Pay additional Fee Issued in PCT Application No. PCT/US2017/060736", dated Feb. 16, 2018, 17 Pages.

"International Search Report and Written Opinion Issued in PCT Application No. PCT/US2017/060733", dated Apr. 25, 2018, 12 Pages.

"International Search Report and Written Opinion Issued in PCT Application No. PCT/US2018/022083", dated Jun. 13, 2018, 17 Pages.

Yin, et al., "Pulse-Based Fast Battery IoT Charger Using Dynamic Frequency and Duty Control Techniques Based on Multi-Sensing of Polarization Curve", In Journal of Energies, vol. 9, Issue 3, Mar. 17, 2016, 20 Pages.

Jiang, et al., "Synergetic Control of Power Converters for Pulse Current Charging of Advanced Batteries From a Fuel Cell Power Source", In Journal of IEEE Transactions on Power Electronics, vol. 19, Issue 4, Jun. 2004, pp. 1140-1150.

"Dual Smart Battery System Manager", http://cds.linear.com/docs/en/datasheet/1760fb.pdf, Retrieved on: Oct. 19, 2016, 48 pages.

"Greenify", https://play.google.com/store/apps/details?id=com.oasisfeng.greenify, Oct. 9, 2016, 5 pages.

"GSam Battery Monitor", https://play.google.com/store/apps/details?id=com.gsamlabs.bbm&hl=en, Jul. 11, 2016, 6 pages.

"Watchdog Task Manager Lite", https://play.google.com/store/apps/details?id=com.zomut.watchdoglite, Feb. 5, 2012, 5 pages.

Badam,"Software Defined Batteries", Symposium on Operating Systems Principles (SOSP'15), Oct. 4, 2015, 15 pages.

Gurries,"Monolithic Dual Battery Power Manager Increases Run Time and Decreases Charge Time", In Linear Technology Magazine, Dec. 2001, 6 pages.

Hoffman,"How to See Which Apps Are Draining Your Battery on an Android Phone or Tablet", http://www.howtogeek.com/244748/how-to-see-which-apps-are-draining-your-battery-on-an-android-phone-or-tablet/, Mar. 15, 2016, 6 pages.

Jiang,"Synergetic Control of Power Converters for Pulse Current Charging of Advanced Batteries From a Fuel Cell Power Source", In Journal of IEEE Transactions on Power Electronics, vol. 19, Issue 4, Jul. 2004, pp. 1140-1150.

Kannan,"Limit Battery Drain on Lollipop by Limiting Background Processes & Killing Apps Activities", http://techtrickz.com/how-to/limit-battery-drain-on-lollipop-by-limiting-background-processes-killing-apps-activities/, Aug. 13, 2015, 7 pages.

Weinberger,"Microsoft has a crazy plan to make your batteries last a lot longer", http://www.businessinsider.com.au/microsoft-research-multiple-batteries-for-a-laptop-project-2015-10?r=US&IR=T, Oct. 5, 2015, 9 pages.

Yin,"Pulse-Based Fast Battery IoT Charger Using Dynamic Frequency and Duty Control Techniques Based on Multi-Sensing of Polarization Curve", In Journal of Energies, vol. 9, Issue 3, Mar. 17, 2016, 20 pages.

Yuan,"GRACE-1: Cross-Layer Adaptation for Multimedia Quality and Battery Energy", In Journal of IEEE Transactions on Mobile Computing, vol. 5, No. 7, Jul. 2006, pp. 799-815.

"Non Final Office Action Issued in U.S. Appl. No. 15/353,581", dated Sep. 14, 2018, 21 Pages.

"Non-Final Office Action Issued in U.S. Appl. No. 15/353,596", dated Aug. 31, 2018, 18 Pages.

"Non Final Office Action Issued in U.S. Appl. No. 15/463,918", dated Sep. 21, 2018, 28 Pages.

"International Search Report and Written Opinion Issued in PCT Application No. PCT/US18/033582", dated Aug. 20, 2018, 17 Pages.

"Non-Final Office Action Issued in U.S. Appl. No. 15/353,548", dated Jan. 7, 2019, 14 Pages.

"Final Office Action Issued in U.S. Appl. No. 15/353,548", dated May 23, 2019, 23 Pages.

"Final Office Action Issued in U.S. Appl. No. 15/463,918", dated Apr. 19, 2019, 35 Pages.

"Non Final Office Action Issued in U.S. Appl. No. 15/633,514", dated Mar. 5, 2019, 24 Pages.

"Final Office Action Issued in U.S. Appl. No. 15/353,581", dated Jun. 20, 2019, 25 Pages.

"Non Final Office Action Issued in U.S. Appl. No. 15/353,548", dated Oct. 1, 2019, 13 Pages.

"Notice of Allowance Issued in U.S. Appl. No. 15/633,514", dated Oct. 21, 2019, 06 Pages.

"Non Final Office Action Issued in U.S. Appl. No. 15/463,918", dated Dec. 11, 2019, 27 Pages.

"Notice of Allowance Issued in U.S. Appl. No. 15/633,514", dated Feb. 12, 2020, 6 Pages.

"Notice of Allowance Issued in U.S. Appl. No. 15/633,514", dated Aug. 29, 2019, 6 Pages.

\* cited by examiner

| Date | Time | Power Mode | Power Source | Battery Saver | Processor Consumption | Screen | User Present | Capacity % | Capacity Remaining | Capacity Drain Rate |
|---|---|---|---|---|---|---|---|---|---|---|
| 4/1/2016 | 12:21:00 AM | Active | Battery | On | 7% | On | Yes | 100.00 | 37,822 | 9369.886 |
| 4/1/2016 | 12:56:12 AM | Connected Standby | Battery | On | 0% | Off | No | 87.00 | 32,325 | 52.736 |
| 4/1/2016 | 1:56:30 AM | Active | Battery | On | 3% | On | Yes | 87.00 | 32,272 | 3614.681 |
| 4/1/2016 | 10:47:49 AM | Active | AC | Off | 12% | On | Yes | 3.00 | 263 | -24,400 |
| 4/1/2016 | 10:55:37 AM | Connected Standby | AC | Off | 0% | Off | Yes | 5.00 | 3435 | -6488.372 |
| 4/1/2016 | 11:05:39 AM | Active | AC | Off | 25% | On | Yes | 13.00 | 4520 | -9519.39 |
| 4/1/2016 | 2:35:33 PM | Active | Battery | Off | 7% | On | Yes | 100.00 | 37,822 | 6266.762 |

Fig. 2

USAGE DATA BASED BATTERY CHARGE OR DISCHARGE TIME DETERMINATION

BACKGROUND

As technology has advanced, mobile computing devices have become increasingly commonplace. Mobile computing devices provide various functionality to users, allowing users to interact with the devices to check email, surf the web, compose text messages, interact with applications, and so on. With mobile computing devices, users are oftentimes concerned with the battery life of their device. However, it can be difficult for a user to know the remaining battery life of their device at any given time. This can result in batteries being depleted at times other than what the users expect, which can lead to user dissatisfaction with their devices.

SUMMARY

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

In accordance with one or more aspects, state information for multiple different states of a computing device is monitored. In response to each change in a value of one or more of the multiple different states, a record of computing device usage data is updated to keep track of energy storage device drain (or charge) by the computing device for each combination of state values. Current state values of the computing device are determined, and based on the current state values and the record, a capacity drain rate (or capacity charge rate) of the energy storage device for the current state values of the computing device is estimated. An estimated remaining time for discharge (or charging) of the energy storage device of the computing device is determined based on the estimated capacity drain rate, and feedback indicating the estimated remaining time for discharge of the energy storage device is provided.

BRIEF DESCRIPTION OF THE DRAWINGS

The detailed description is described with reference to the accompanying figures. In the figures, the left-most digit(s) of a reference number identifies the figure in which the reference number first appears. The use of the same reference numbers in different instances in the description and the figures may indicate similar or identical items. Entities represented in the figures may be indicative of one or more entities and thus reference may be made interchangeably to single or plural forms of the entities in the discussion.

FIG. 2 illustrates an example record of usage data recorded by the usage tracking module in accordance with one or more embodiments.

DETAILED DESCRIPTION

Usage data based battery charge or discharge time determination is discussed herein. Usage data of a computing device is maintained over some time period, such as a couple weeks or a couple months. This usage data reflects an amount of energy that is used or stored for a given combination of different state values of the computing device. The state values include various device state information, such as a screen state (e.g., on or off), a power source state (e.g., battery or AC), a power mode state (e.g., active, connected standby, or off), a battery saver state (e.g., on or off), a processor consumption state (e.g., percentage of processor being used), and so forth. Each time there is a change in value of a state a record is updated and an amount of power that is used or stored (e.g., how much the battery was drained or charged) until the next change of state is recorded. Over time, this provides a record of how much a battery is drained or charged while the computing device is being used for a given combination of the various state values.

The record of usage data is used to estimate an amount of time it will take until the battery is fully discharged or fully charged. At any given time, the computing device can determine the current state settings of the computing device. The amount of power used or stored for the current state settings of the computing device can be determined from the record of usage data, and it is assumed that the amount of power used or stored for the computing device currently will be approximately the same as the amount of power previously used or stored for the current state settings. This assumed amount of power used or stored, in combination with a current remaining capacity of the battery, allows an estimated amount of time it will take until the battery is fully discharged or fully charged to be determined.

The techniques discussed herein provide an estimate of an amount of time it will take until a battery is fully charged or fully discharged that is based on prior usage of the computing device. This provides a more accurate estimation of the amount of time it will take until the battery is fully charged or fully discharged, providing more accurate information to the user of the computing device. The techniques discussed herein allow the user to be provided with a better understanding of the amount of time he or she has remaining before the battery is fully charged or discharged, and allows the user to make more intelligent and informed choices regarding how to use the computing device.

Figure 1:
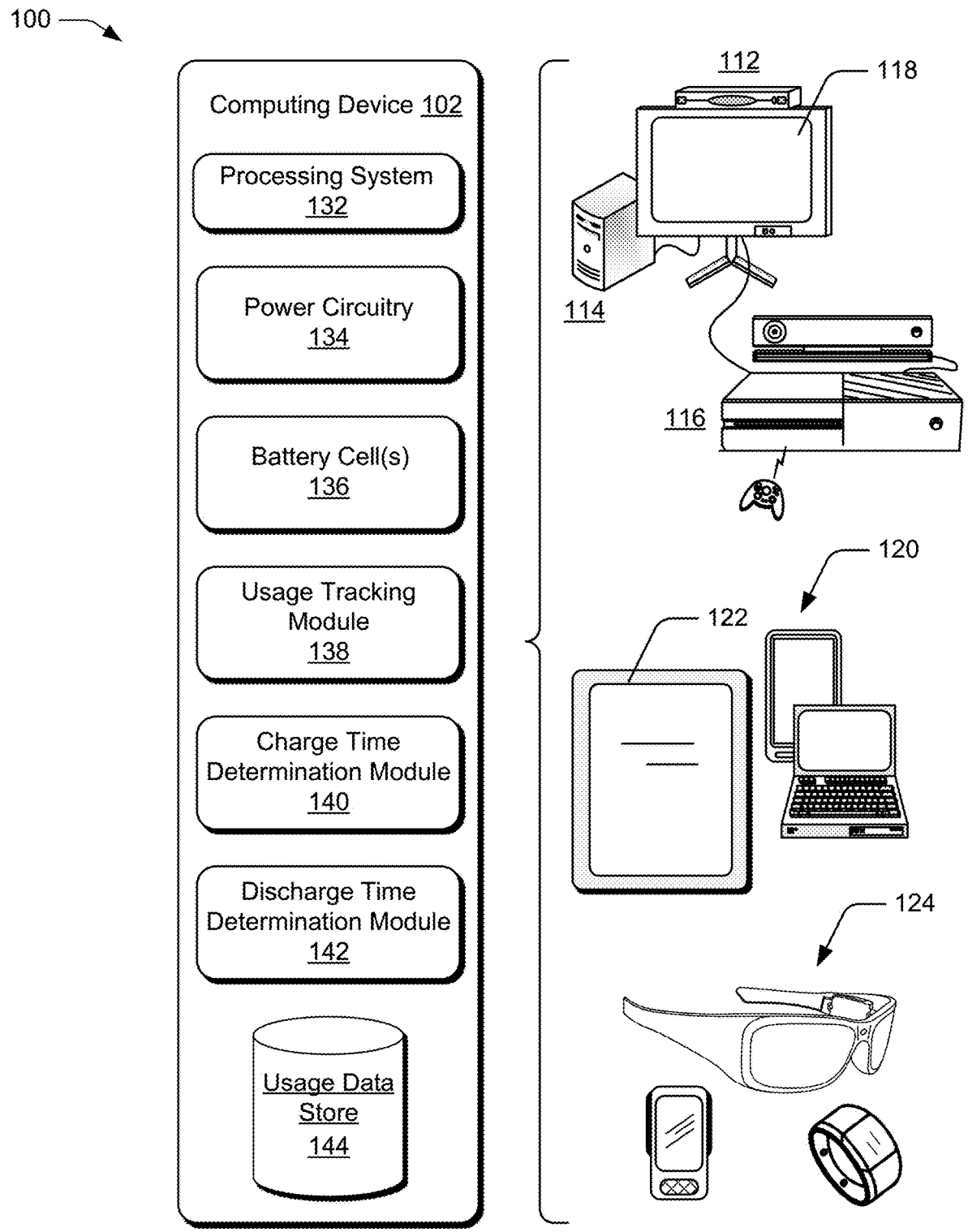
FIG. 1 illustrates an example operating environment in which the usage data based battery charge or discharge time determination can be implemented in accordance with one or more embodiments.

FIG. 1 illustrates an example operating environment 100 in which the usage data based battery charge or discharge time determination can be implemented in accordance with one or more embodiments. Operating environment 100 can be embodied as any suitable computing system and/or device such as, by way of example and not limitation, a gaming system, a desktop computer, a portable computer, a tablet or slate computer, a handheld computer such as a personal digital assistant (PDA), a cell phone, a set-top box, a wearable device (e.g., watch, band, glasses, augmented reality (AR) headsets, virtual reality (VR) headsets, etc.), and the like. For example, as shown in FIG. 1 the computing device 102 can be implemented as a television client device 112, a computer 114, and/or a gaming system 116 that is connected to a display device 118 to display media content. Alternatively, the computing device may be any type of portable computer, mobile phone, Internet-of-Things (IoT) device, or portable device 120. Such a computing device 120 optionally includes an integrated display 122. A computing device may also be configured as a wearable device 124 that is designed to be worn by, attached to, carried by, or otherwise transported by a user. Examples of wearable devices 124 depicted in FIG. 1 include glasses, a smart band or watch, and a pod device such as clip-on fitness device, media player, or tracker. Other examples of wearable devices 124 include but are not limited to badges, a key fob, an access card, and a ring, an article of clothing, a glove, or a bracelet, to name a few examples. A computing device may also be implemented as part of another device or product, such as an electric vehicles. Any of the computing devices can be implemented with various components, such as one or more processors and memory devices, as well as with any combination of differing components.

The computing device 102 includes a processing system 132. The processing system 132 may be configured to include a single processor with one or more processor cores included on the same chip or integrated circuit. Alternatively, the processing system 132 may be configured to include multiple independent processors configured in parallel or in series, each including one or more processor cores included on the same chip or integrated circuit. In one or more implementations, the processing system 132 may include multiple processing cores that provide a range of performance capabilities, processing efficiencies, and power usage characteristics.

The processing system 132 can execute various firmware and/or software instructions of various modules or components of the computing device 102. These firmware and/or software instructions can include programs of an operating system (OS) of the computing device 102, programs run by the OS of the computing device 102, and so forth. For example, the processing system 132 can execute programs that provide a wide range of functionality to the computing device 102, including but not limited to gaming, office productivity, email, media management, printing, networking, web-browsing, and so forth Computing device 102 also includes power circuitry 134 and battery cell(s) 136, from which computing device 102 can draw power to operate. Generally, power circuitry 134 may include firmware and/or hardware configured to enable computing device 102 to draw operating power from battery cells 136 or to apply charging power to battery cells 136. Battery cells 136 may include any suitable number or type of rechargeable battery cells, such as lithium-ion (Lion), lithium-polymer (Li-Poly), lithium ceramic (Li-C), and the like. Different battery cells 136 within the computing device 102 can be the same or different types of cells. These different types of cells can have various different characteristics, such as different sizes/capacities, chemistries, battery technologies, shapes, state of charge (SOC), age, temperature, and so forth. Various combinations of battery cell(s) may be utilized to provide a range of capacities, performance capabilities, efficiencies, and power usage characteristics.

Although discussed as battery cells(s) 136, it should be noted that the techniques discussed herein can be implemented with other energy storage devices. Any devices that store energy, as opposed to being an external plug-in AC power source, can be used as battery cell(s) 136, such as supercapacitors.

The computing device 102 also includes a usage tracking module 138, a charge time determination module 140, a discharge time determination module 142, and a usage data store 144. The usage data store 144 can be implemented as any of a variety of different storage devices, such as a magnetic disk, optical disc, Flash memory, and so forth. Although illustrated as being part of the computing device 102, the usage data store 144 can additionally or alternatively be implemented as a device separate from the computing device 102. For example, the usage data store 144 can be a removable storage device that plugs into the computing device 102, the usage data store 144 can be an external storage device that uses a wired (e.g., universal serial bus (USB)) or wireless (e.g., wireless USB) connection to communicate with the computing device 102, the usage data store 144 can be an external storage device connects to the computing device 102 via a network (e.g., the Internet, a local area network (LAN), or other data network), such as a cloud storage service.

The usage tracking module 138 maintains a record of usage data in the usage data store 144. The usage data includes state information for the computing device 102 as well as capacity information regarding the battery cells(s) 136. The state information for the computing device 102 is any of a variety of different settings that can affect draining or charging the battery cell(s) 136, and/or any of a variety of different values that reflect a rate at which the battery cell(s) 136 are drained or charged.

In one or more embodiments, the usage tracking module 138 maintains a record of usage data including values for power source state, power mode state, battery saver state, processor consumption state, screen state, and user present state. Each of these different states can have various different values at different times during operation of the computing device, as discussed in more detail below.

The power source state refers to source of power for the computing device 102. In one or more embodiments, the power source state value can be battery power (e.g., battery cell(s) 136) or external power (e.g., AC power). The usage tracking module 138 can obtain an indication of the source of power for the computing device 102 at any given time from various different sources, such as the power circuitry 134, an operating system running on the computing device 102, the battery cell(s) 136, and so forth.

The power mode state refers to an operational mode that the computing device 102 is operating in. In one or more embodiments, the power mode state value can be active, connected standby, or off. The active power mode state refers to the computing device 102 being powered on and running programs. The off power mode state refers to the computing device 102 being powered off and thus running no programs. The connected standby power mode state refers to the computing device 102 being in a low power mode where programs are not typically run, but that can be transitioned to the active power mode state in response to an input to the device (e.g., a user input, an incoming wireless message or signal (e.g., indicating a received phone call, text message, and so forth). The usage tracking module 138 can obtain an indication of the power mode state for the computing device 102 at any given time from various different sources, such as the power circuitry 134, an operating system running on the computing device 102, and so forth.

The battery saver state refers to what power conservation mode the computing device 102 is in. The computing device 102 can support one or more different power conservation modes in which the computing device 102 employs various different techniques to reduce power consumption in the computing device 102, such as reducing a clock speed of a processor or core included as part of the processing system 132, powering down certain components or hardware of the computing device 102, and so forth. In one or more embodiments, the battery saver state value can be either on (power conservation is enabled in the computing device 102) or off (power conservation is not enabled in the computing device 102). Alternatively, the battery saver state value can be off or one of multiple different power conservation states. Each of these multiple different power conservation states an reduce power consumption in the computing device 102 in different manners. For example, one power conservation state may reduce the clock speed of a processor that is part of the processing system 132, and another power conservation state may reduce the clock speed of a processor that is part of the processing system 132 as well as power down one or more hardware components of the computing device 102. The usage tracking module 138 can obtain an indication of the battery saver state for the computing device 102 at any given time from various different sources, such as an operating system running on the computing device 102.

The processor consumption state refers to utilization of the processors(s) and/or processor core(s) in the processing system 132. In one or more embodiments, the processor consumption state is a value indicating how much of the processing capacity of the processing system 132 is being used at any given time, such as a percentage of the processing capacity (e.g., 5%, 12%, etc.). The value indicating how much of the processing capacity of the processing system 132 is being used at any given time can optionally be rounded, such as to a closest integer value, to a closest one of a particular number (e.g., 20) of values (e.g., 0%, 5%, 10%, 15%, etc.). The usage tracking module 138 can obtain an indication of the utilization of the processor(s) and/or processor core(s) in the processing system 132 at any given time from various different sources, such as an operating system running on the computing device 102.

Additionally or alternatively, the processor consumption state can refer to other information reflecting the utilization of the processors(s) and/or processor core(s) in the processing system 132. For example, the processor consumption state can include other available information regarding the processor utilization, such as an instruction count (e.g., how many instructions are executed over some duration of time) or a cycle count (the frequency of the processor(s) and/or processor core(s)). By way of another example, the processor consumption state can include the power state that each processor and/or processor core is running in, a frequency or frequency bucket (e.g., which of multiple different frequency ranges or states) the processor(s) and/or processor core(s) are running in, and so forth.

It should be noted the processing system 132 can include multiple processors and/or multiple processor cores as discussed above. In such situations, the utilizations of each of these different processors and/or cores are combined to generate the value indicating how much of the processing capacity of the processing system 132 is being used. The utilizations of these different processors and/or cores can be combined in different manners, such as averaging the utilizations, performing a weighted averaging on the utilizations (e.g., processors and/or cores having greater processing capacity (e.g., as measured by some value, such as the number of instructions per second that can be executed) being given higher weights that processors and/or cores having less processing capacity), and so forth.

The screen state refers to whether the screen of the computing device 102 is turned on or turned off. The screen of the computing device 102 refers to a screen (a display) that is powered by the battery cell(s) 136 when the computing device 102 is being powered by the battery cell(s) 136 (as opposed to, for example, AC power). In one or more embodiments, the screen state value can be on (the screen is powered on) or off (the screen is powered off). Additionally or alternatively, the screen state values can include indications of screen brightness (e.g., as a percentage of a maximum supported screen brightness, as one of multiple different brightness settings (e.g., low, medium, or high), and so forth). The usage tracking module 138 can obtain an indication of the screen state for the computing device 102 at any given time from various different sources, such as an operating system running on the computing device 102, the screen of the computing device 102, and so forth.

The user present state refers to whether a user is present at the computing device 102. In one or more embodiments, the user present state value can be either present (a user is present at the computing device 102) or absent (a user is not present at the computing device 102). The usage tracking module 138 can determine whether a user is present at the computing device 102 in a variety of different manners. In one or more embodiments, a user is determined to be present at the computing device 102 if user input (e.g., keyboard input, voice input, touchscreen input) has been received within a threshold amount of time (e.g., within the previous 20 seconds), and determined to be absent if user input has not been received within the threshold amount of time. Additionally or alternatively, whether a user is present or absent can be determined in other manners. For example, the computing device 102 can include a camera and use image (e.g., facial) recognition to detect faces within a threshold distance (e.g., 5 feet or 10 feet) of the computing device 102. If a face is detected within a threshold distance then a user is present at the computing device 102, and if a face is not detected within a threshold distance then a user is absent from (not present at) the computing device 102.

The usage tracking module 138 also records a capacity drain or charge for a particular combination of state settings. In situations in which the battery cell(s) 136 are being used to power the computing device during some time duration, a capacity drain is generated by determining the difference between the remaining capacity of the battery cell(s) 136 at the start of the time duration and the remaining capacity of the battery cell(s) 136 at the end of the time duration (e.g., by subtracting the remaining capacity of the battery cell(s) 136 at the end of the time duration from the remaining capacity of the battery cell(s) 136 at the start of the time duration). The remaining capacity of the battery cell(s) 136 at any given time can be readily determined in various manners. In one or more embodiments, an indication of the remaining capacity of the battery cell(s) over time is maintained by the battery cell(s) 136, and thus can be readily obtained by the usage tracking module 138 querying the battery cell(s) 136.

In situations in which the battery cell(s) 136 are not being used to power the computing device during some time duration (e.g., the computing device 102 is running on AC power and the battery cell(s) 136 are being charged), a capacity charge (also referred to as a capacity gain) is generated by determining the difference between the remaining capacity of the battery cell(s) 136 at the start of the time duration and the remaining capacity of the battery cell(s) 136 at the end of the time duration (e.g., by subtracting the remaining capacity of the battery cell(s) 136 at the start of the time duration from the remaining capacity of the battery cell(s) 136 at the end of the time duration, or by subtracting the remaining capacity of the battery cell(s) 136 at the end of the time duration from the remaining capacity of the battery cell(s) 136 at the start of the time duration and recording the capacity charge as a negative capacity drain). The remaining capacity of the battery cell(s) 136 at any given time can be readily determined in various manners. In one or more embodiments, an indication of the remaining capacity of the battery cell(s) over time is maintained by the battery cell(s) 136, and thus can be readily obtained by the usage tracking module 138 querying the battery cell(s) 136

The usage tracking module 138 monitors the different state settings at the computing device 102, and generates a new record or entry in the usage data store 144 each time there is a change in the state settings for the computing device 102. The time duration over which the capacity drain or charge of the battery cell(s) is determined is thus not a fixed time—the time duration will vary based on how long it is until at least one of the state settings changes.

The usage tracking module 138 can monitor the different state settings and determine when a change is made to a state setting in a variety of different manners. In one or more embodiments, the usage tracking module 138 queries various components or programs (e.g., hardware components, operating system programs, etc.) at regular or irregular intervals to obtain the state settings. For example, the usage tracking module 138 can be configured to query the operating system running on the computing device 102 for the current processor utilization of the processors(s) and/or processor core(s) in the processing system 132 every five seconds. Additionally or alternatively, the usage tracking module 138 can register with a program (e.g., of an operating system running on the computing device 102) to receive messages or notifications whenever there is a change to a particular one or more state settings of the computing device 102, and the program sends a message or other notification to the usage tracking module 138 in response to a change in the particular one or more state settings of the computing device 102. For example, the usage tracking module 138 can register with an operating system running on the computing device 102 to receive notifications of changes to the power conservation mode the computing device 102 is running in, and receive a message or other notification from the operating system in response to each change in the power conservation mode for the computing device 102.

FIG. 2 illustrates an example record 200 of usage data recorded by the usage tracking module in accordance with one or more embodiments. The record 200 includes multiple entries shown as rows in the record 200. Each row in the record 200 corresponds to a different time duration identified by values in the date column 202 and the time column 204. A time duration begins at the date and time of the entry, and ends at the date and time of the next entry. For example, the first entry shows a time duration that starts on Apr. 1, 2016 at 12:21:00 AM and ends on Apr. 1, 2016 at 12:56:12 AM.

The record 200 shows multiple different state settings as follows. The power mode column 206 shows a power mode state value for each time duration. The power source column 208 shows a power source state value for each time duration. The battery saver column 210 shows a battery saver state value for each time duration. The processor consumption column 212 shows a processor consumption state value for each time duration. The screen column 214 shows a screen state value for each time duration. The user present column 216 shows a user present state value for each time duration.

The record 200 also shows capacity information for the battery cell(s) for each time duration as additional columns. The capacity % column 218 shows a percentage of the battery capacity that remains in the battery cell(s) at the beginning of the time duration. The capacity remaining column 220 shows an amount of energy (e.g., in milliampere hours (mAh)) remaining in the battery cell(s) at the beginning of the time duration. The capacity drain rate column 222 shows a value that is a rate of capacity (e.g., in milliampere (mA) per hour (mA/h)) drained during the time duration. The value in the capacity drain rate column 222 for a given time duration can be determined by subtracting, from the value in the capacity remaining column 220, the value in the capacity remaining column 220 for the next time duration, and dividing the difference by the amount of time in the time duration.

Thus, for example, looking at the first row (entry) in the record 200, the time duration begins on Apr. 1, 2016 at 12:21:00 AM. The power mode state value is "active", the power source state value is "battery", the battery saver state value is "on", the processor consumption state value is "7%", the screen state value is "on", the user present state value is "yes", the percentage of the battery capacity that remains in the battery cell(s) at the beginning of the time duration is 100.00%, the capacity remaining at the beginning of the time duration is 37,822 mAh, and the capacity drain during the time duration (which ends at the beginning of the next row, on Apr. 1, 2016 at 12:56:12 AM) is 5497 mAh. The capacity drain is generated by subtracting from the capacity remaining at the beginning of the time duration (37,822 mAh) the capacity remaining at the beginning of the next time duration (32,325 mAh), and dividing the difference (5497 mAh) by the amount of time in the time duration. The time duration begins on Apr. 1, 2016 at 12:21:00 AM and ends on Apr. 1, 2016 at 12:56:12 AM, which is 35 minutes and 12 seconds, which is equal to 0.587 hours. Dividing the difference of 5497 mAh by the amount of time 0.587 hours (h), results in a capacity drain rate of 9369.886 mAh (5497÷0.587=9369.886).

In the illustrated example of FIG. 2, in the capacity drain rate column 222 battery cell drain is shown by positive values and battery cell charge is shown by negative values. For example, a value of −9519.39 for a time duration indicates that the battery cell(s) were charged at a rate of 9519.39 mA/h during that time duration. It should be noted that charging rate can alternatively be shown in different manners, such as by a different column (e.g., a capacity charge rate column rather than a capacity drain rate column).

It should be noted that the illustrated example of FIG. 2 is an example, and that not all of the state values shown in FIG. 2 need be recorded by the usage tracking module 138. For example, the user present state may not be determined and recorded in the usage data by the usage tracking module 138. By way of another example, the capacity drain rate 222 may be determined as needed based on the other values in the record 200 rather than being recorded in the record 200. Additionally or alternatively, it should be noted that additional values of additional states that can affect draining or charging the battery cell(s) 136, and/or that affect any of a variety of different values that reflect a rate at which the battery cell(s) 136 are drained or charged, can be recorded in the usage data by the usage tracking module 138.

It should also be noted that the record 200 is illustrated as a table. A table is an example of a data structure that can be used to record the usage data, and any of a variety of other data structures can additionally or alternatively be used to record the usage data. For example, the record may be listed as database entries, as elements of a linked list, and so forth. It should also be noted that although a single record 200 is illustrated in FIG. 2, multiple different records can be maintained. For example, rather than a single record for draining and charging the battery cell(s), one record can be maintained recording usage data when draining the battery cell(s), and another record can be maintained recording usage data when charging the battery cell(s).

Returning to FIG. 1, the computing device 102 includes the charge time determination module 140 and the discharge time determination module 142. The discharge time determination module 142 determines an estimated amount of time until the battery cell(s) 136 are fully discharged (e.g., dropping to or below a threshold capacity, such as 0 mAh or 50 mAh). The discharge time determination module 142 determines the amount of time until the battery cell(s) 136 are fully discharged by determining the current capacity remaining of the battery cell(s) 136 and the current state values for the computing device 102. These values can be obtained in a variety of different manners as discussed above with regard to usage tracking module 138 collecting usage data. Additionally or alternatively, the discharge time determination module 142 can access the entry in the usage data store 144 for the current time duration (e.g., the row in the record 200 of FIG. 2 that includes the current time) and obtain the state values from the record 200.

The discharge time determination module 142 identifies previous time durations from the usage data store 144 that had the same state values as the current state values and corresponding to the battery cell(s) discharging (e.g., having positive capacity drain rates). The capacity drain rates for those previous time durations are then used to determine a current estimated capacity drain rate for the computing device 102. Given a current estimated capacity drain rate and a current remaining capacity of the battery cell(s) 136, an estimated amount of time until the battery cell(s) 136 are fully discharged can be readily generated. For example, the current remaining capacity of the battery cell(s) 136 can be divided by the current estimated capacity drain rate. E.g., if the current remaining capacity of the battery cell(s) is 2000 mAh, and the capacity drain rate is 500 mA/hour, then the estimated amount of time until the battery cell(s) 136 are fully discharged is 2000÷500=4 hours.

In situations in which the usage data in the usage data store 144 includes only a single previous time duration having the same state values as the current state values corresponding to the battery cell(s) discharging (e.g., having positive capacity drain rates), then the capacity drain rate for that single previous time duration is used as the current estimated capacity drain rate for the computing device 102.

However, if the usage data in the usage data store 144 includes multiple previous time durations each having the same state values as the current state values corresponding to the battery cell(s) discharging, then the current estimated capacity drain rate for the computing device 102 is generate by combining the capacity drain rates from multiple ones of those previous time durations. The capacity drain rates from multiple ones of the previous time durations can be combined in a variety of different manners. In one or more embodiments, the capacity drain rates from all of the previous time durations are averaged to generate the current estimated capacity drain rate. Alternatively, the capacity drain rates from a subset (e.g., a threshold number, such as the previous 15) of the previous time durations are averaged to generate the current estimated capacity drain rate.

Various other manners of combining the capacity drain rates of previous time durations can alternatively be used. In one or more embodiments, a weighted averaging is applied so that the capacity drain rates from more recently occurring previous time durations have a heavier weighting than the capacity drain rates from older previous time durations. For example, the capacity drain rates from previous time durations in the preceding day can be given higher weights in the averaging process than capacity drain rates from previous time durations two weeks ago. The weighted averaging can be implemented in any of a variety of different manners, such as assigning a weight equal to 1 divided by the number of weeks old the previous time duration is, so capacity drain rates from previous time durations in the past 0-6 days would be given a weight of 1÷1=1.0, capacity drain rates from previous time durations 7-13 days in the past would be given a weight of 1÷2=0.5, capacity drain rates from previous time durations 14-20 days in the past would be given a weight of 1÷3=0.33, and so forth. This averaging process giving heavier weights to more recently occurring previous time durations allows the capacity drain rates from more recent previous time durations, which more likely reflect the current configuration of the computing device 102 (e.g., the same programs, the same hardware, etc.), and thus can more accurately reflect the current capacity drain rate for the computing device 102.

Additionally or alternatively, a weighted averaging can be applied so that the capacity drain rates from previous time durations occurring at times that correspond to the current time are given higher weights in the averaging process than capacity drain rates from previous time durations that occurred at times that do not correspond to the current time. Whether a previous time duration corresponds to the current time can be determined in various different manners. In one or more embodiments, a previous time duration corresponds to the current time if the previous time duration includes the current time but on a different date. E.g., if the current time is 12:25:20 AM on Apr. 2, 2016, then a previous time duration spanning 12:21:00 AM to 12:56:12 AM on Apr. 1, 2016 would be a corresponding previous time duration for the current time, but a previous time duration spanning 11:05:39 AM to 2:35:33 PM on Apr. 1, 2016 would not be a corresponding previous time duration for the current time. Additionally or alternatively, a previous time duration corresponds to the current time if the previous time duration occurs on the same day of the week (or the same week of the month) as the current time duration. E.g., if the current time is 12:25:20 AM on Apr. 2, 2016 (and assuming Apr. 2, 2016 is a Saturday), then a previous time duration occurring on Mar. 19, 2016 (a Saturday) would be a corresponding previous time duration for the current time, but a previous time duration occurring on Apr. 1, 2016 (a Friday) would not be a corresponding previous time duration for the current time.

In one or more embodiments, a previous time duration corresponds to the current time if the previous time duration includes the current time but on a different date and on the same day of the week as the current time. E.g., if the current time is 12:25:20 AM on Apr. 2, 2016 (and assuming Apr. 2, 2016 is a Saturday), then a previous time duration spanning 12:15:00 to 12:45:00 AM on Mar. 19, 2016 (a Saturday) would be a corresponding previous time duration for the current time, but a previous time duration spanning 12:15:00 to 12:45:00 AM on Apr. 1, 2016 (a Friday) would not be a corresponding previous time duration for the current time, and a previous time duration spanning 1:15:00 AM to 1:35:14 AM on Mar. 19, 2016 would not be a corresponding previous time duration for the current time.

The averaging process giving higher weights to capacity drain rates from corresponding previous time durations than non-corresponding previous time durations can be implemented in a variety of different manners. For example, in one or more embodiments, the capacity drain rates from corresponding previous time durations are given a weight of 1.0, and the capacity drain rates from non-corresponding previous time durations a weight of 0.5 or 0.0.

It should be noted that the averaging process can give higher weights to capacity drain rates from corresponding previous time durations than non-corresponding previous time durations and also give higher weights to capacity drain rates from more recently occurring previous time durations capacity drain rates from older previous time durations. For example, the averaging process can give the highest weight(s) to corresponding previous time durations that are most recent, and the lowest weight(s) to non-corresponding previous time durations that are several weeks in the past.

This averaging process giving heavier weights to corresponding previous time durations allows discharge time determination module 142 to take into account similar activities in determining the current capacity drain rate. For example, a user may have a weekly conference call that uses a Web conferencing client running on the computing device 102 every Wednesday morning from 9:00 to 9:30. If the current time is a Wednesday morning at 9:01, then the discharge time determination module 142 can assume that the current capacity drain rate will likely be approximately the same as the capacity drain rate during previous Wednesday mornings at 9:01, assuming the current state values of the computing device 102 are the same as during previous Wednesday mornings at 9:01.

Additionally or alternatively, other manners of combining the capacity drain rates of previous time durations can be used. For example, rather than a linear regression, the capacity drain rates can be input to an equation producing a curved projection.

In one or more embodiments, additional seed data can be provided to the discharge time determination module 142. This seed data can be stored in the usage data store 144 and/or in other storage devices or locations. The seed data is additional data analogous to the user device, providing capacity discharge rates for different combinations of state values. This seed data can be data provided by a manufacturer, developer, or distributor of the computing device 102. For example, a computing device having the same hardware and software installed (or at least a threshold amount of the same software, such as 90% of the same software) as the computing device 102 can be tested in a lab for various different combinations of state values that are expected to be common, the resultant capacity discharge rate can be determined, and that data can be seed data for the discharge time determination module 142.

Such seed data can additionally or alternatively be crowd sourced information, such as from a cloud service. Various different computing devices can provide their usage data to the cloud service, and the computing device 102 can obtain the usage data from the cloud service for other computing devices having the same hardware and software installed (or at least a threshold amount of the same software, such as 90% of the same software) as the computing device 102. Similarly, the usage tracking module 138 can provide usage data for the computing device 102 to the cloud service, allowing the computing device 102 to participate in the crowd sourcing and making the usage data from the computing device 102 available to other computing devices. The usage data provided by the computing device 102 can be stored as separate data that is provided to other devices, or alternatively is averaged or otherwise combined with the usage data from other computing devices maintained at the cloud service.

The seed data can be used in a variety of different manners. In one or more embodiments, the seed data is treated the same as the usage data generated by the usage tracking module 138. This allows, for example, the discharge time determination module 142 to have access to usage data when the computing device 102 is new (fresh out of the box) and/or if the usage data in usage data store 144 were to be deleted (e.g., accidentally). Additionally or alternatively, the seed data is treated as having a different importance than the usage data generated at the computing device 102, such as being less important than the usage data generated at the computing device 102, such as by giving the seed data a lower weight relative to the usage data of the computing device 102 maintained by the usage tracking module 138. This allows, for example, the discharge time determination module 142 to have access to usage data from other computing devices to supplement the usage data maintained by the usage tracking module 138 based on the operation of the computing device 102, but still give the usage data of the computing device 102 maintained by the usage tracking module 138 more influence in the discharge time determination process than the crowd sourced data.

The charge time determination module 140 determines an estimated amount of time until the battery cell(s) 136 are fully charged (e.g., rising to or above a threshold capacity, such as the maximum capacity of the battery cell(s) 136 or within 50 mAh of the maximum capacity of the battery cell(s) 136). Although a maximum capacity of the battery cell(s) is discussed herein, it should be noted that this maximum capacity can be an absolute maximum or a value within a threshold amount of the maximum (e.g., within 50 mAh of the theoretical maximum capacity of the battery cell(s) 136). The charge time determination module 140 determines the amount of time until the battery cell(s) 136 are fully charged based on the current capacity remaining of the battery cell(s) 136, the maximum capacity of the battery cell(s) 136, and the current state values for the computing device 102. These values can be obtained in a variety of different manners as discussed above with regard to usage tracking module 138 collecting usage data. Additionally or alternatively, the charge time determination module 140 can access the entry in the usage data store 144 for the current time duration (e.g., the row in the record 200 of FIG. 2 that includes the current time) and obtain the state values from the record 200.

The charge time determination module 140 operates similarly to the discharge time determination module 142, but determines an amount of time until the battery cell(s) are fully charged rather than fully discharged. The charge time determination module 140 identifies previous time durations from the usage data store 144 that had the same state values as the current state values and corresponding to the battery cell(s) charging (e.g., having negative capacity drain rates). The capacity charge rates (e.g., the capacity drain rates that are negative values) for those previous time durations are then used to determine a current estimated capacity charge rate for the computing device 102. The charge time determination module 140 also generates a current desired charge amount, which is the difference between the maximum capacity of the battery cell(s) 136 and the current remaining capacity of the battery cell(s) 136. Given a current estimated capacity charge rate and a current desired charge amount, an estimated amount of time until the battery cell(s) 136 are fully charged can be readily generated. For example, the current desired charge amount can be divided by the current estimated capacity charge rate. E.g., if the current desired charge amount of the battery cell(s) is 12,000 mAh, and the capacity charge rate is 4800 mA/hour, then the estimated amount of time until the battery cell(s) 136 are fully charged is 12,000÷4800=2.5 hours.

In situations in which the usage data in the usage data store 144 includes only a single previous time duration having the same state values as the current state values corresponding to the battery cell(s) charging (e.g., having negative capacity drain rates), then the capacity charge rate for that single previous time duration is used as the current estimated capacity charge rate for the computing device 102.

However, if the usage data in the usage data store 144 includes multiple previous time durations each having the same state values as the current state values and corresponding to the battery cell(s) charging, then the current estimated capacity charge rate for the computing device 102 is generate by combining the capacity charge rates from multiple ones of those previous time durations. The capacity charge rates from multiple ones of the previous time durations can be combined in a variety of different manners, analogous to the discussion above regarding combining capacity drain rates. For example, capacity charge rates from previous time durations can be averaged together, a weighted averaging can be applied so that the capacity charge rates from more recently occurring previous time durations have a heavier weighting than the capacity charge rates from older previous time durations, a weighted averaging can be applied so that the capacity charge rates from previous time durations occurring at times that correspond to the current time are given higher weights in the averaging process than capacity charge rates from previous time durations that occurred at times that do not correspond to the current time, the capacity charge rates can be input to an equation producing a curved projection rather than a linear regression, and so forth. The charge time determination module 140 also optionally uses seed data as discussed above. The seed data can be data from a manufacturer, developer, or distributor of the computing device 102, or crowd sourced data. The usage data including capacity charge rates can also optionally be provided to a crowd sourcing service, analogous to the usage data including capacity discharge rates discussed above.

Figure 3:
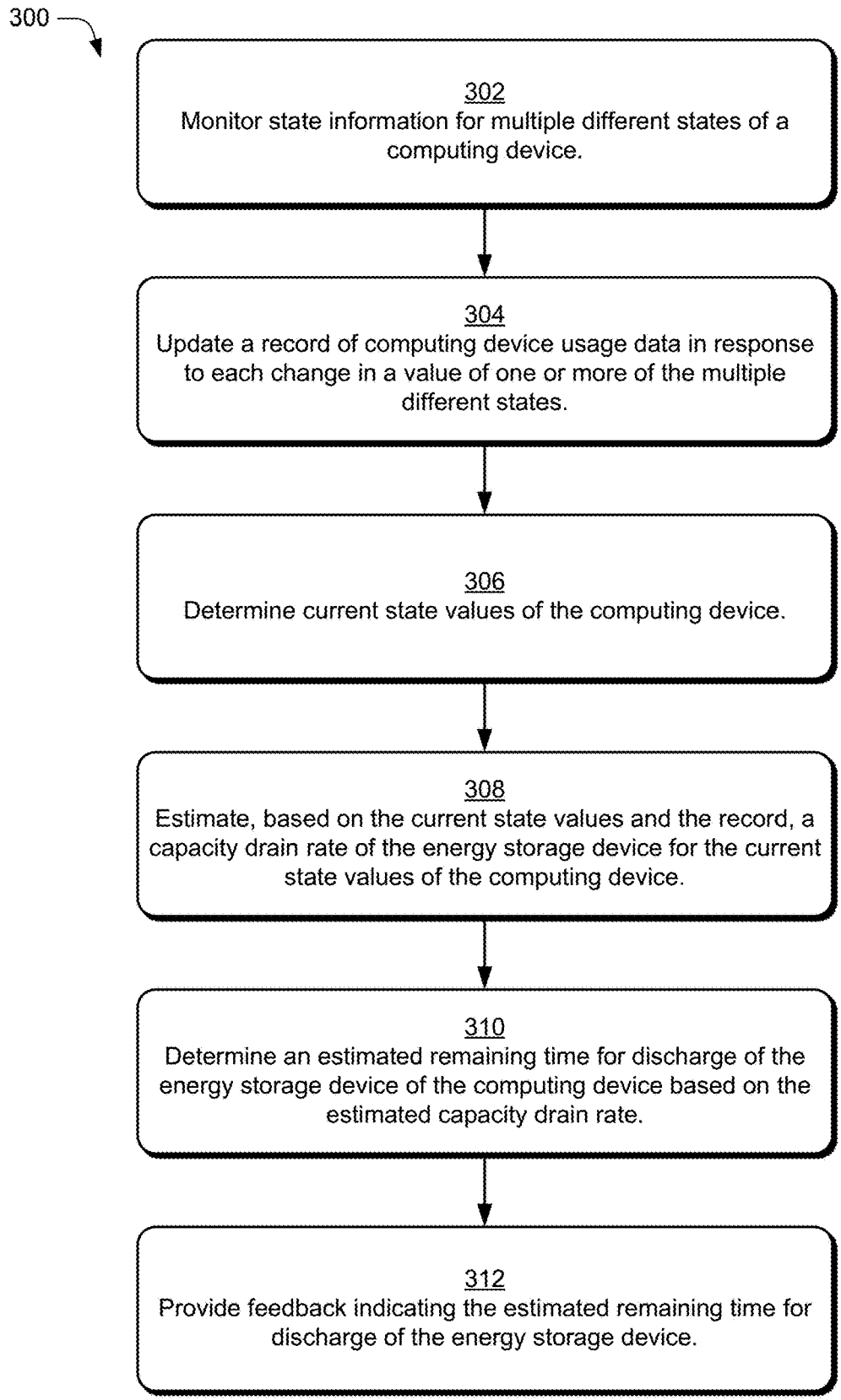
FIG. 3 is a flowchart illustrating an example process for usage data based battery discharge time determination in accordance with one or more embodiments.

FIG. 3 is a flowchart illustrating an example process 300 for usage data based battery discharge time determination in accordance with one or more embodiments. Process 300 is carried out by a computing device, such as computing device 102 of FIG. 1, and can be implemented in software, firmware, hardware, or combinations thereof. Process 300 is shown as a set of acts and is not limited to the order shown for performing the operations of the various acts. Process 300 is an example process for usage data based battery discharge time determination; additional discussions of usage data based battery discharge time determination are included herein with reference to different figures.

In process 300, state information for multiple different states of a computing device is monitored (act 302). The values of these different states can be obtained from various different sources, such as hardware of the computing device, firmware of the computing device, programs (e.g., the operating system) running on the computing device, and so forth. These different states can include, for example, a power source state, a power mode state, a battery saver state, a processor consumption state, a screen state, and/or a user present state as discussed above.

A record of computing device usage data is updated in response to each change in a value of one or more of the multiple different states (act 304). This record allows the computing device to keep track of energy storage device (e.g., battery) drain by the computing device for each combination of state values.

Current state values of the computing device are also determined (act 306). The current state values can be determined in response to various events, such as an amount of time elapsing, a request from a user to display an amount of time until the computing device is fully discharged, a request from another module or device, and so forth.

A capacity drain rate of the energy storage device for the current state values is estimated (act 308). This estimated capacity drain rate is determined based on the current state values, the record of computing device usage, and a remaining capacity of the energy storage device, as discussed above. Various different capacity drain rates determined for previous time durations during which the computing device had the same state values as the current state values are used to determine the estimated capacity drain rate as discussed above.

An estimated remaining time for discharge of the energy storage device based is determined (act 310). This estimate is based on both the estimated capacity drain rate and the remaining capacity of the energy storage device as discussed above.

Feedback indicating the estimated remaining time for discharge of the energy storage device is provided (act 312). This feedback can take various forms, such as displaying or audibly playing a number of hours and/or minutes until the energy storage device is estimated to be fully discharged. This feedback can additionally or alternatively be provided to various other components or modules of the computing device to take various actions based on the estimated remaining time for discharge of the energy storage device.

Figure 4:
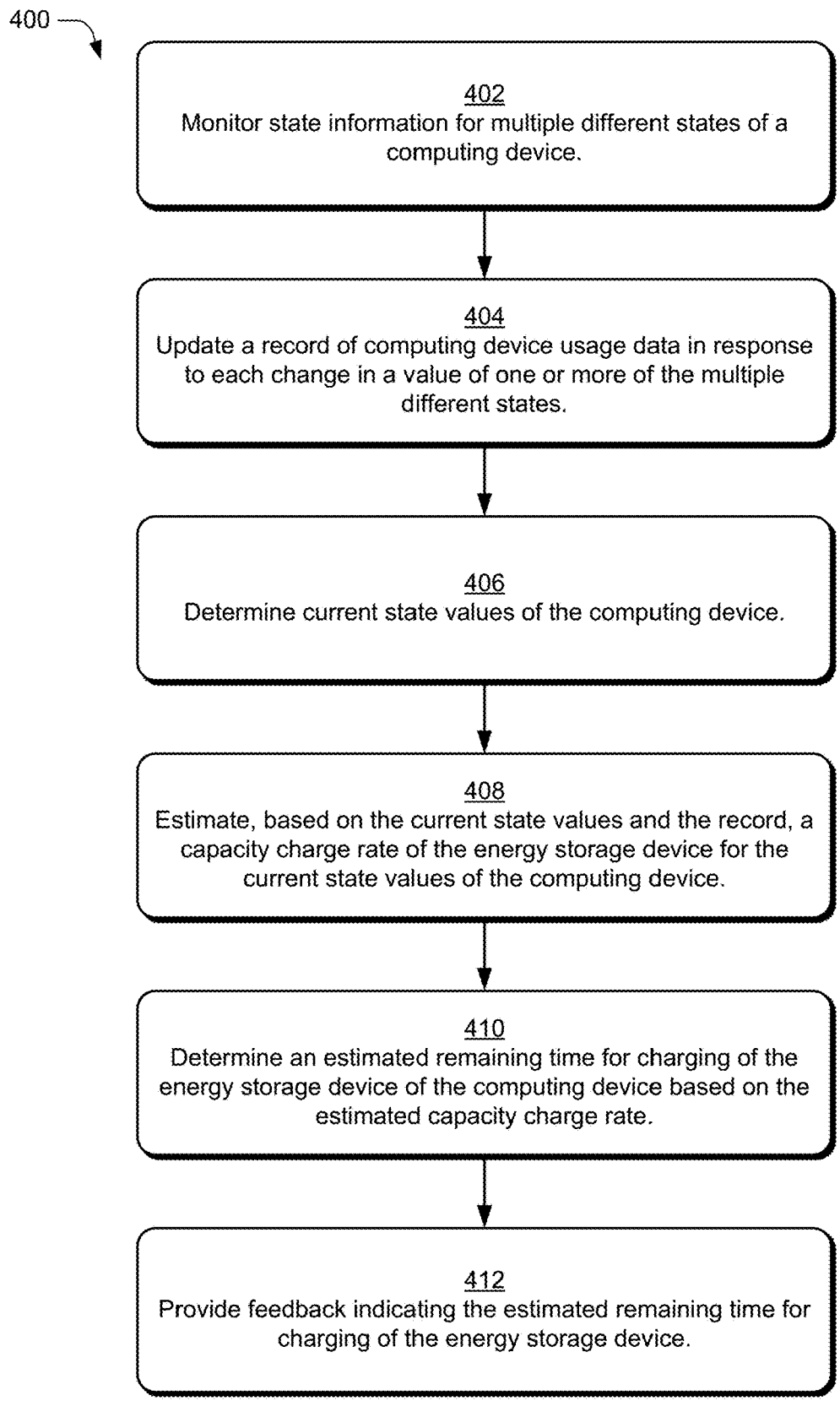
FIG. 4 is a flowchart illustrating an example process for usage data based battery charge time determination in accordance with one or more embodiments.

FIG. 4 is a flowchart illustrating an example process 400 for usage data based battery charge time determination in accordance with one or more embodiments. Process 400 is carried out by a computing device, such as computing device 102 of FIG. 1, and can be implemented in software, firmware, hardware, or combinations thereof. Process 400 is shown as a set of acts and is not limited to the order shown for performing the operations of the various acts. Process 400 is an example process for usage data based battery charge time determination; additional discussions of usage data based battery charge time determination are included herein with reference to different figures.

In process 400, state information for multiple different states of a computing device is monitored (act 402). The values of these different states can be obtained from various different sources, such as hardware of the computing device, firmware of the computing device, programs (e.g., the operating system) running on the computing device, and so forth. These different states can include, for example, a power source state, a power mode state, a battery saver state, a processor consumption state, a screen state, and/or a user present state as discussed above.

A record of computing device usage data is updated in response to each change in a value of one or more of the multiple different states (act 404). This record allows the computing device to keep track of energy storage device (e.g., battery) charge by the computing device for each combination of state values.

Current state values of the computing device are also determined (act 406). The current state values can be determined in response to various events, such as an amount of time elapsing, a request from a user to display an amount of time until the computing device is fully charged, a request from another module or device, and so forth.

A capacity charge rate of the energy storage device for the current state values is estimated (act 408). This estimated capacity charge rate is determined based on the current state values, the record of computing device usage, a remaining capacity of the energy storage device, and a maximum capacity of the energy storage device as discussed above. Various different capacity charge rates determined for previous time durations during which the computing device had the same state values as the current state values are used to determine the estimated capacity charge rate as discussed above.

An estimated remaining time for charging of the energy storage device based is determined (act 410). This estimate is based on the estimated capacity charge rate, the remaining capacity of the energy storage device, and a maximum capacity of the energy storage device as discussed above.

Feedback indicating the estimated remaining time for charging of the energy storage device is provided (act 412). This feedback can take various forms, such as displaying or audibly playing a number of hours and/or minutes until the energy storage device is estimated to be fully discharged. This feedback can additionally or alternatively be provided to various other components or modules of the computing device to take various actions based on the estimated remaining time for charging of the energy storage device.

Although particular functionality is discussed herein with reference to particular modules, it should be noted that the functionality of individual modules discussed herein can be separated into multiple modules, and/or at least some functionality of multiple modules can be combined into a single module. Additionally, a particular module discussed herein as performing an action includes that particular module itself performing the action, or alternatively that particular module invoking or otherwise accessing another component or module that performs the action (or performs the action in conjunction with that particular module). Thus, a particular module performing an action includes that particular module itself performing the action and/or another module invoked or otherwise accessed by that particular module performing the action.

Figure 5:
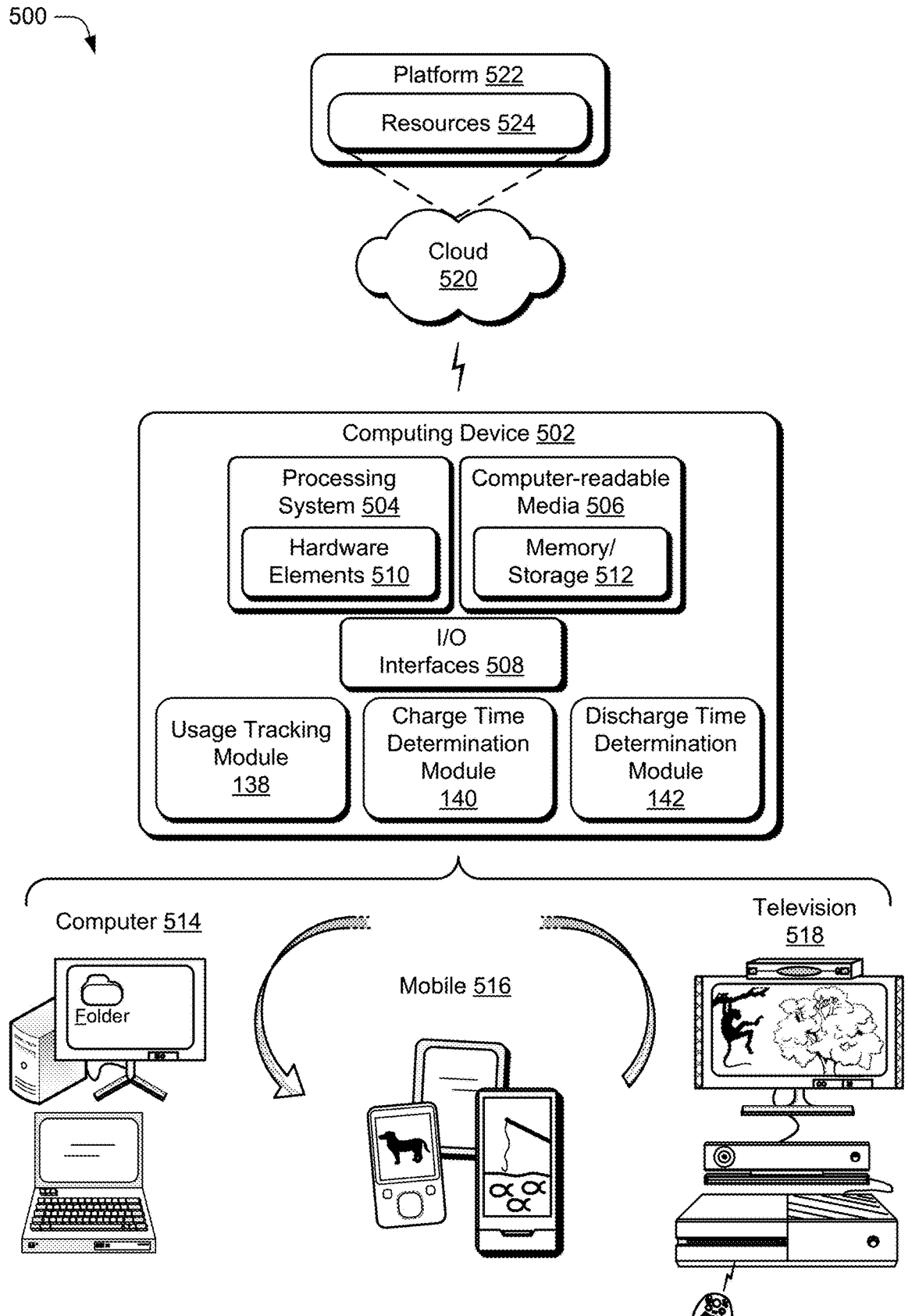
FIG. 5 illustrates an example system that includes an example computing device that is representative of one or more computing systems and/or devices that may implement the various techniques described herein.

FIG. 5 illustrates an example system 500 that includes an example computing device 502 that is representative of one or more computing systems and/or devices that may implement the various techniques described herein. The computing device 502 may be, for example, a mobile device, a wearable device, an on-chip system, and/or any other suitable computing device or computing system.

The example computing device 502 as illustrated includes a processing system 504, one or more computer-readable media 506, and one or more I/O interfaces 508 that are communicatively coupled, one to another. Although not shown, the computing device 502 may further include a system bus or other data and command transfer system that couples the various components, one to another. A system bus can include any one or combination of different bus structures, such as a memory bus or memory controller, a peripheral bus, a universal serial bus, and/or a processor or local bus that utilizes any of a variety of bus architectures. A variety of other examples are also contemplated, such as control and data lines.

The processing system 504 is representative of functionality to perform one or more operations using hardware. Accordingly, the processing system 504 is illustrated as including hardware elements 510 that may be configured as processors, functional blocks, and so forth. This may include implementation in hardware as an application specific integrated circuit or other logic device formed using one or more semiconductors. The hardware elements 510 are not limited by the materials from which they are formed or the processing mechanisms employed therein. For example, processors may be comprised of semiconductor(s) and/or transistors (e.g., electronic integrated circuits (ICs)). In such a context, processor-executable instructions may be electronically-executable instructions.

The computer-readable media 506 is illustrated as including memory/storage 512. The memory/storage 512 represents memory/storage capacity associated with one or more computer-readable media. The memory/storage 512 may include volatile media (such as random access memory (RAM)) and/or nonvolatile media (such as read only memory (ROM), Flash memory, optical disks, magnetic disks, and so forth). The memory/storage 512 may include fixed media (e.g., RAM, ROM, a fixed hard drive, and so on) as well as removable media (e.g., Flash memory, a removable hard drive, an optical disc, and so forth). The computer-readable media 506 may be configured in a variety of other ways as further described below.

Input/output interface(s) 508 are representative of functionality to allow a user to enter commands and information to computing device 502, and also allow information to be presented to the user and/or other components or devices using various input/output devices. Examples of input devices include a keyboard, a cursor control device (e.g., a mouse), a microphone for voice operations, a scanner, touch functionality (e.g., capacitive or other sensors that are configured to detect physical touch), a camera (e.g., which may employ visible or non-visible wavelengths such as infrared frequencies to detect movement that does not involve touch as gestures), and so forth. Examples of output devices include a display device (e.g., a monitor or projector), speakers, a printer, a network card, tactile-response device, and so forth. Thus, the computing device 502 may be configured in a variety of ways as further described below to support user interaction.

Various techniques may be described herein in the general context of software, hardware elements, or program modules. Generally, such modules include routines, programs, objects, elements, components, data structures, and so forth that perform particular tasks or implement particular abstract data types. The terms "module," "functionality," and "component" as used herein generally represent software, firmware, hardware, or a combination thereof. The features of the techniques described herein are platform-independent, meaning that the techniques may be implemented on a variety of commercial computing platforms having a variety of processors.

An implementation of the described modules and techniques may be stored on or transmitted across some form of computer-readable media. The computer-readable media may include a variety of media that may be accessed by the computing device 502. By way of example, and not limitation, computer-readable media may include "computer-readable storage media" and "communication media."

"Computer-readable storage media" refers to media and/or devices that enable storage of information in contrast to mere signal transmission, carrier waves, or signals per se. Computer-readable storage media does not include signal bearing media, transitory signals, or signals per se. The computer-readable storage media includes hardware such as volatile and non-volatile, removable and non-removable media and/or storage devices implemented in a method or technology suitable for storage of information such as computer readable instructions, data structures, program modules, logic elements/circuits, or other data. Examples of computer-readable storage media may include, but are not limited to, RAM, ROM, EEPROM, flash memory or other memory technology, CD-ROM, digital versatile disks (DVD) or other optical storage, hard disks, magnetic cassettes, magnetic tape, magnetic disk storage or other magnetic storage devices, or other storage device, tangible media, or article of manufacture suitable to store the desired information and which may be accessed by a computer.

"Communication media" may refer to signal-bearing media that is configured to transmit instructions to the hardware of the computing device 502, such as via a network. Communication media typically may embody computer readable instructions, data structures, program modules, or other data in a modulated data signal, such as carrier waves, data signals, or other transport mechanism. Communication media also include any information delivery media. The term "modulated data signal" means a signal that has one or more of its characteristics set or changed in such a manner as to encode information in the signal. By way of example, and not limitation, communication media include wired media such as a wired network or direct-wired connection, and wireless media such as acoustic, RF, infrared, and other wireless media.

As previously described, hardware elements 510 and computer-readable media 506 are representative of instructions, modules, programmable device logic and/or fixed device logic implemented in a hardware form that may be employed in some embodiments to implement at least some aspects of the techniques described herein. Hardware elements may include components of an integrated circuit or on-chip system, an application-specific integrated circuit (ASIC), a field-programmable gate array (FPGA), a complex programmable logic device (CPLD), and other implementations in silicon or other hardware devices. In this context, a hardware element may operate as a processing device that performs program tasks defined by instructions, modules, and/or logic embodied by the hardware element as well as a hardware device utilized to store instructions for execution, e.g., the computer-readable storage media described previously.

Combinations of the foregoing may also be employed to implement various techniques and modules described herein. Accordingly, software, hardware, or program modules including the usage tracking module 138, the charge time determination module 140, the discharge time determination module 142, and other program modules may be implemented as one or more instructions and/or logic embodied on some form of computer-readable storage media and/or by one or more hardware elements 510. The computing device 502 may be configured to implement particular instructions and/or functions corresponding to the software and/or hardware modules. Accordingly, implementation of modules as a module that is executable by the computing device 502 as software may be achieved at least partially in hardware, e.g., through use of computer-readable storage media and/or hardware elements 510 of the processing system. The instructions and/or functions may be executable/operable by one or more articles of manufacture (for example, one or more computing devices 502 and/or processing systems 504) to implement techniques, modules, and examples described herein.

As further illustrated in FIG. 5, the example system 500 enables ubiquitous environments for a seamless user experience when running applications on a personal computer (PC), a television device, and/or a mobile device. Services and applications run substantially similar in all three environments for a common user experience when transitioning from one device to the next while utilizing an application, playing a video game, watching a video, and so on.

In the example system 500, multiple devices are interconnected through a central computing device. The central computing device may be local to the multiple devices or may be located remotely from the multiple devices. In one embodiment, the central computing device may be a cloud of one or more server computers that are connected to the multiple devices through a network, the Internet, or other data communication link.

In one embodiment, this interconnection architecture enables functionality to be delivered across multiple devices to provide a common and seamless experience to a user of the multiple devices. Each of the multiple devices may have different physical requirements and capabilities, and the central computing device uses a platform to enable the delivery of an experience to the device that is both tailored to the device and yet common to all devices. In one embodiment, a class of target devices is created and experiences are tailored to the generic class of devices. A class of devices may be defined by physical features, types of usage, or other common characteristics of the devices.

In various implementations, the computing device 502 may assume a variety of different configurations, such as for computer 514, mobile 516, and television 518 uses. Each of these configurations includes devices that may have generally different constructs and capabilities, and thus the computing device 502 may be configured according to one or more of the different device classes. For instance, the computing device 502 may be implemented as the computer 514 class of a device that includes a personal computer, desktop computer, a multi-screen computer, laptop computer, netbook, and so on.

The computing device 502 may also be implemented as the mobile 516 class of device that includes mobile devices, such as a mobile phone, portable music player, portable gaming device, a tablet computer, a multi-screen computer, and so on. The computing device 502 may also be implemented as the television 518 class of device that includes devices having or connected to generally larger screens in casual viewing environments. These devices include televisions, set-top boxes, gaming consoles, and so on.

The techniques described herein may be supported by these various configurations of the computing device 502 and are not limited to the specific examples of the techniques described herein. This is illustrated through inclusion of the schedule-based energy storage device selection system 126 and the energy storage device system 128 on the computing device 502. The functionality represented by schedule-based energy storage device selection system 126 and other modules/applications may also be implemented all or in part through use of a distributed system, such as over a "cloud" 520 via a platform 522 as described below.

The cloud 520 includes and/or is representative of a platform 522 for resources 524. The platform 522 abstracts underlying functionality of hardware (e.g., servers) and software resources of the cloud 520. The resources 524 may include applications and/or data that can be utilized while computer processing is executed on servers that are remote from the computing device 502. Resources 524 can also include services provided over the Internet and/or through a subscriber network, such as a cellular or Wi-Fi network.

The platform 522 may abstract resources and functions to connect the computing device 502 with other computing devices. The platform 522 may also serve to abstract scaling of resources to provide a corresponding level of scale to encountered demand for the resources 524 that are implemented via the platform 522. Accordingly, in an interconnected device embodiment, implementation of functionality described herein may be distributed throughout the system 500. For example, the functionality may be implemented in part on the computing device 502 as well as via the platform 522 that abstracts the functionality of the cloud 520.

In the discussions herein, various different embodiments are described. It is to be appreciated and understood that each embodiment described herein can be used on its own or in connection with one or more other embodiments described herein. Further aspects of the techniques discussed herein relate to one or more of the following embodiments.

A method comprising: monitoring state information for multiple different states of a computing device; updating a record, in response to each change in a value of one or more of the multiple different states, of computing device usage data to keep track of energy storage device drain by the computing device for each combination of state values; determining current state values of the computing device; estimating, based on the current state values and the record, a capacity drain rate of the energy storage device for the current state values of the computing device; determining an estimated remaining time for discharge of the energy storage device of the computing device based on the estimated capacity drain rate; and providing feedback indicating the estimated remaining time for discharge of the energy storage device.

Alternatively or in addition to any of the above described methods, any one or combination of: the energy storage device comprising one or more battery cells; the multiple different states including a power source state and a power mode state; the power source state including values of battery or external power, the power mode state including values of active, connected standby, and off; the multiple states further including a battery saver state; the battery saver state including values of on or off; the multiple different states including a processor consumption state having a value that indicates a utilization of the processors and/or processor cores of the computing device; the multiple different states including a screen state with values indicating whether a screen of the computing device is powered on or powered off; the multiple different states including a user present state with values indicating whether a user is present at the computing device; the estimating the capacity drain rate of the energy storage device comprising combining the capacity drain rates from previous time durations in the record having the same state values as the current state values; the combining comprising applying a weighted averaging to the capacity drain rates from the previous time durations, the weighted averaging giving a heavier weighting to capacity drain rates from more recent time durations than capacity drain rates from older time durations; the combining comprising applying a weighted averaging to the capacity drain rates from the previous time durations, the weighted averaging giving a heavier weighting to capacity drain rates from previous time durations that correspond to a current time than to previous time durations that do not correspond to the current time; the method further comprising estimating, based on the current state values and the record, a capacity charge rate of the energy storage device for the current state settings of the computing device, determining an estimated remaining time for charging of the energy storage device of the computing device based on the estimated capacity charge rate, and providing feedback indicating the estimated remaining time for charging of the energy storage device; a computing device implementing any of the above described methods.

A method comprising: monitoring state information for multiple different states of a computing device; updating a record, in response to each change in value of one or more of the multiple different states, of computing device usage data to keep track of energy storage device charge by the computing device for each combination of state values; determining current state values of the computing device; estimating, based on the current state values and the record, a capacity charge rate of the energy storage device for the current state settings of the computing device; determining an estimated remaining time for charging of the energy storage device of the computing device based on the estimated capacity charge rate; and providing feedback indicating the estimated remaining time for charging of the energy storage device; a computing device implementing any of the above described methods.

Alternatively or in addition to any of the above described methods, any one or combination of: the estimating the capacity charge rate of the energy storage device comprising combining the capacity charge rates from previous time durations in the record having the same state values as the current state values; the combining comprising applying a weighted averaging to the capacity charge rates from the previous time durations, the weighted averaging giving a heavier weighting to capacity charge rates from more recent time durations than capacity charge rates from older time durations; the combining comprising applying a weighted averaging to the capacity charge rates from the previous time durations, the weighted averaging giving a heavier weighting to capacity charge rates from previous time durations that correspond to a current time than to previous time durations that do not correspond to the current time.

A computing device comprising: one or more processors; and a computer-readable storage medium having stored thereon multiple instructions that, responsive to execution by the one or more processors, cause the one or more processors to: monitor state information for multiple different states of the computing device, the multiple different states including a processor consumption state having a value that indicates a utilization of the one or more processors; update a record, in response to each change in a value of one or more of the multiple different states, of computing device usage data to keep track of energy storage device drain by the computing device for each combination of state values; determine current state values of the computing device; estimate, based on the current state values and the record, a capacity drain rate of the energy storage device for the current state values of the computing device; determine an estimated remaining time for discharge of the energy storage device of the computing device based on the estimated capacity drain rate; and provide feedback indicating the estimated remaining time for discharge of the energy storage device.

Alternatively or in addition to any of the above described computing devices, any one or combination of: wherein to estimate the capacity drain rate of the energy storage device comprises combining the capacity drain rates from previous time durations in the record having the same state values as the current state values, the combining comprising applying a weighted averaging to the capacity drain rates from the previous time durations, the weighted averaging giving a heavier weighting to capacity drain rates from more recent time durations than capacity drain rates from older time durations; wherein to estimate the capacity drain rate of the energy storage device comprises combining the capacity drain rates from previous time durations in the record having the same state values as the current state values, the combining comprising applying a weighted averaging to the capacity drain rates from the previous time durations, the weighted averaging giving a heavier weighting to capacity drain rates from previous time durations that correspond to a current time than to previous time durations that do not correspond to the current time.

CONCLUSION

Although the example implementations have been described in language specific to structural features and/or methodological acts, it is to be understood that the implementations defined in the appended claims are not necessarily limited to the specific features or acts described. Rather, the specific features and acts are disclosed as example forms of implementing the claimed features.

What is claimed is:

1. A method performed by a computing device comprised of storage hardware, processing hardware, and an energy storage device, the method comprising:
    storing, in the storage hardware, a chronology log, the chronology log comprising records, each record comprising respective state values of respective different states of the computing device captured for a respectively corresponding different time slice, each record also comprising respectively corresponding power information, the power information of each record corresponding to a rate of charging or discharging the energy storage device for a time slice corresponding to the record, wherein the time slices of the respective records do not overlap in time;
    monitoring acquired state values for the multiple different states of a computing device, respectively, the monitoring including acquiring the acquired state values and comparing the acquired state values to stored state values to determine that a state value of a given acquired state has changed relative to a prior state value of the given state;
    in response to each detected change in a state value of one or more of the multiple different states, inserting a corresponding new record to the chronology log, the new record comprising the acquired state values of the respective different states and also comprising new power information corresponding to a time slice of the new record;
    capturing, at a point in time, current state values of the respective different states of the computing device;
    finding one or more records in the chronology log by searching for records in the chronology log that have state values that respectively match the current state values of the point in time, and estimating remaining time for discharge of the energy storage device of the computing device based on the power information of the one or more found records and based on estimated current state of the energy storage device; and
    displaying feedback indicating the estimated remaining time.

2. The method of claim 1, the energy storage device comprising one or more battery cells.

3. The method of claim 1, the multiple different states including a power source state and a power mode state.

4. The method of claim 3, values of the power source state including values indicating battery or external power, values of the power mode state including values indicating active, connected standby, or off.

5. The method of claim 3, the multiple states further including a battery saver state.

6. The method of claim 5, the battery saver state including values of on or off.

7. The method of claim 1, the multiple different states including a processor consumption state having values that indicate utilization of the processors and/or processor cores of the processing hardware.

8. The method of claim 1, the multiple different states including a screen state with values indicating whether a screen of the computing device is powered on or powered off.

9. The method of claim 1, the multiple different states including a user present state with values indicating whether a user is present at the computing device.

10. The method of claim 1, the estimating the remaining time comprising combining the power information from respective found records.

11. The method of claim 10, wherein the power information of the respective records respectively comprise capacity drain rates of the energy storage device.

12. The method of claim 11, further comprising combining the capacity drain rates of the found records by applying a recency-weighted averaging to the capacity drain rates from the found records.

13. The method of claim 1, further comprising:
    estimating, based on the current state values and the one or more found records, a capacity charge rate of the energy storage device for the current state values of the computing device; and
    determining an estimated remaining time for charging of the energy storage device of the computing device based on the estimated capacity charge rate.

14. A method comprising:
    monitoring state values for respective multiple different state characteristics of a computing device, the computing device comprising an energy storage device and a display;
    forming a chronology log comprising records of the state values by inserting new records to the chronology log in response to changes in values of one or more of the multiple different state characteristics detected by the monitoring, each inserted new record comprising respective values of the state characteristics captured for a respectively corresponding time slice, each inserted new record also comprising charge information of the energy storage device for the respectively corresponding time slice, wherein each record stores state values for a respectively corresponding different time slice, and wherein the time slices represented by the respective records do not overlap in time;
    capturing, at a point in time, current state values of the computing device for the respective state characteristics;
    identifying, based on the current state values of the point in time, a record in the chronology log, the record identified by being determined to contain state values that correspond to the current state values, and determining a charge or discharge rate of the energy storage device according to the charge information of the identified record;
    determining an estimated remaining time for charging or discharging of the energy storage device of the computing device based on the estimated charge or discharge rate; and
    displaying, on the display, graphics indicating the estimated remaining time for charging or discharging of the energy storage device.

15. The method of claim 14, wherein the estimating the charge or discharge rate of the energy storage device comprises combining the charge or discharge rates obtained or derived from respective records determined to have the same state characteristic values as the current state characteristic values.

16. The method of claim 15, the combining comprising applying a weighted averaging to the charge or discharge rates from the records, the weighted averaging giving a heavier weighting to charge or discharge rates from more recent records than charge or discharge rates from older records.

17. A method performed by a computing device, the method comprising:

maintaining a usage chronology log by monitoring characteristics of the computing device, the usage chronology log comprising entries, each entry representing a respective slice of time during which the monitored characteristics were not determined to change by the monitoring, each entry comprising values of the respective characteristics obtained by the monitoring, each entry further comprising power usage rate information for a different corresponding slice of time, wherein the slices of times represented by the respective entries do not overlap in time;

each time the monitoring determines that a value for a monitored characteristic has changed, current values of the respective monitored characteristics are captured and a new entry is inserted into the usage chronology log, the new entry comprising the captured current values of the respective monitored characteristics, the captured current values including the changed value that caused the new entry to be inserted into the usage chronology log;

computing a time amount by:
  obtaining an estimated current charge of the battery;
  obtaining current values of the respective monitored characteristics at a point in time;
  searching for the current values in the usage chronology log to find one or more entries in the usage chronology log that have values that match the current values; and
  computing the time amount based on the estimated current charge of the battery and based on the power usage rate information of the one or more found entries.

18. A method according to claim 17, wherein each entry's power usage rate information comprises corresponding charge information and corresponding time duration information.

19. A method according to claim 17, wherein the searching finds multiple entries in the usage chronology log that have values that match the current values, and wherein the computing the time amount is based on the estimated current charge of the battery and is based on the power usage rate information of the found entries.

20. A method according to claim 17, wherein one of the monitored characteristics include a characteristic of whether the computing device is being interacted with by a user.

* * * * *